(12) United States Patent
Kosaka et al.

(10) Patent No.: US 11,422,456 B2
(45) Date of Patent: Aug. 23, 2022

(54) PHASE SHIFT MASK BLANK, METHOD FOR PRODUCING PHASE SHIFT MASK, AND PHASE SHIFT MASK

(71) Applicant: SHIN-ETSU CHEMICAL CO., LTD., Tokyo (JP)

(72) Inventors: Takuro Kosaka, Joetsu (JP); Naoki Matsuhashi, Joetsu (JP); Shohei Mimura, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 17/462,991

(22) Filed: Aug. 31, 2021

(65) Prior Publication Data
US 2022/0082929 A1    Mar. 17, 2022

(30) Foreign Application Priority Data

Sep. 17, 2020 (JP) .............................. JP2020-156635

(51) Int. Cl.
*G03F 1/32* (2012.01)
*H01L 21/033* (2006.01)

(52) U.S. Cl.
CPC ............ *G03F 1/32* (2013.01); *H01L 21/0332* (2013.01); *H01L 21/0337* (2013.01)

(58) Field of Classification Search
None
See application file for complete search history.

(56) References Cited

U.S. PATENT DOCUMENTS

| 5,474,864 A | 12/1995 | Isao et al. |
| 6,037,083 A | 3/2000 | Mitsui |
| 2007/0212618 A1 | 9/2007 | Yoshikawa et al. |
| 2009/0176325 A1 | 7/2009 | Jeon et al. |
| 2015/0198873 A1* | 7/2015 | Okubo ...................... G03F 1/80 430/5 |
| 2018/0129130 A1* | 5/2018 | Shishido ............. C23C 14/0682 |

FOREIGN PATENT DOCUMENTS

| JP | H07-140635 A | 6/1995 |
| JP | 2007-033469 A | 2/2007 |
| JP | 2007-233179 A | 9/2007 |
| JP | 2007-241065 A | 9/2007 |
| KR | 100373317 B1 | 5/2003 |

OTHER PUBLICATIONS

Feb. 18, 2022 Search Report issued in European Patent Application No. 21195781.6.

* cited by examiner

*Primary Examiner* — Roberts P Culbert

(74) *Attorney, Agent, or Firm* — Oliff PLC

(57) ABSTRACT

A phase shift mask blank has a transparent substrate and a phase shift film formed on the transparent substrate. The phase shift film has a phase difference of 160 to 200° and a transmittance of 3 to 15% at exposure wavelength of 200 nm or less and includes a lower layer and an upper layer in order from the transparent substrate side. The upper layer contains transition metal, silicon, nitrogen and/or oxygen, or silicon, nitrogen and/or oxygen. The lower layer contains chromium, silicon, nitrogen and/or oxygen, and the content of silicon is 3% or more to less than 15% for the sum of chromium and silicon in the lower layer. The ratio of oxygen content to the total content of chromium and silicon is less than 1.7, and etching selectivity of the upper layer is 10 or more compared to the lower layer in fluorine-based dry etching.

20 Claims, 2 Drawing Sheets

[FIG. 1]
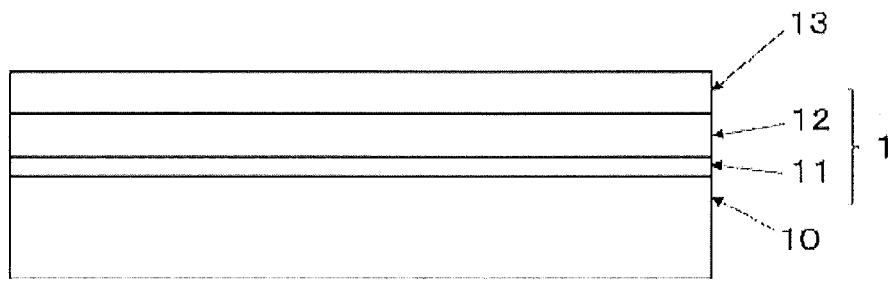
[FIG. 2]
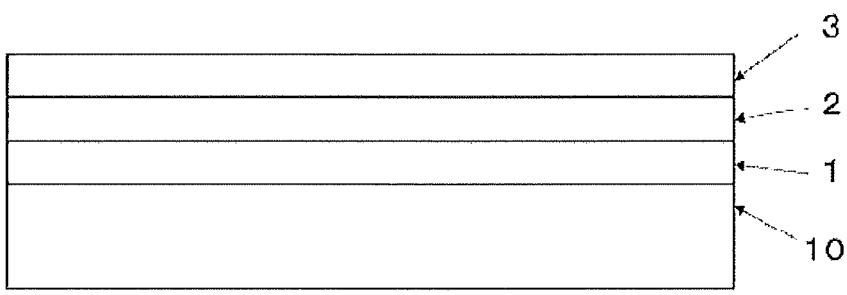
[FIG. 3]
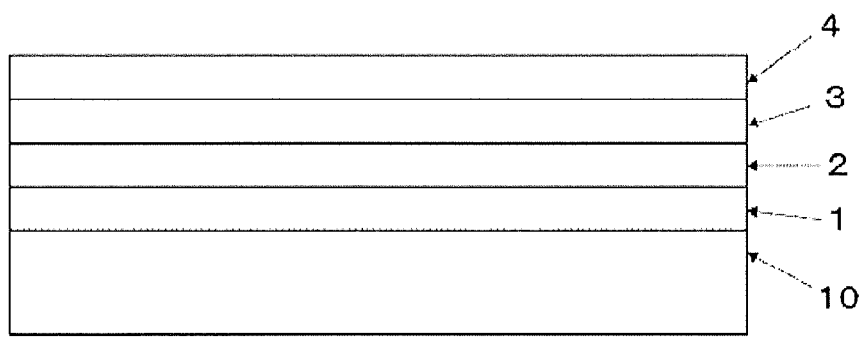

[FIG. 4]
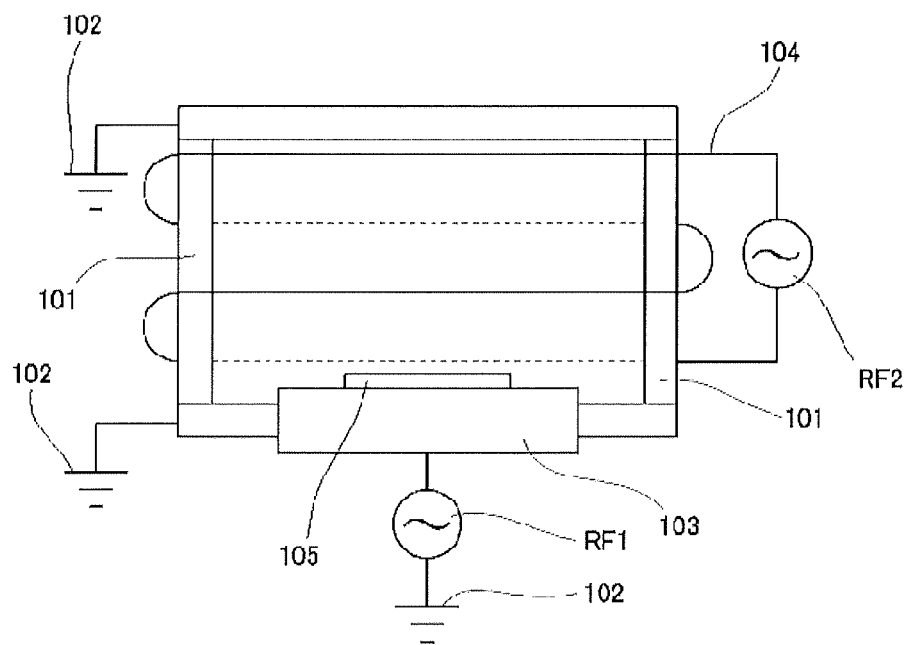

PHASE SHIFT MASK BLANK, METHOD FOR PRODUCING PHASE SHIFT MASK, AND PHASE SHIFT MASK

TECHNICAL FIELD

The present invention relates to a phase shift mask blank, a method for producing a phase shift mask, and a phase shift mask, used for manufacturing a semiconductor integrated circuit or the like.

BACKGROUND ART

A phase shift method is used as one of resolution enhancement technologies in photolithography technology used in semiconductor technology. The phase shift method, for example, uses a photomask that a phase shift film is formed on a substrate. The phase shift method is a contrast enhancing method by utilizing interference of light caused by a phase shift film pattern formed on a photomask substrate that is transparent to exposure light. The phase shift film pattern has a phase difference of approximately 180° between a light through the phase shift film and an exposure light through a portion where the phase shift film is not formed, in other words, an exposure light through air having the length same as the thickness of the phase shift film.

One of the photomasks applied to this is a halftone phase shift mask. The halftone phase shift mask includes a transparent substrate made of quartz or the like which is transparent to exposure light, and a mask pattern of a halftone phase shift film which is formed on the transparent substrate and has a phase shift of approximately 180° to a phase through a portion not formed the phase shift film, and a transmittance substantively insufficient to contribute to exposure. Up to now, a film containing molybdenum and silicon (MoSi-based phase shift film) has been mainly used as the phase shift film of the phase shift mask (Patent Document 1).

CITATION LIST

Patent Literature

Patent Document 1: JP H07-140635 A
Patent Document 2: JP 2007-33469 A
Patent Document 3: JP 2007-233179 A
Patent Document 4: JP 2007-241065 A

SUMMARY OF INVENTION

Technical Problem

In general, in a phase shift mask having a MoSi phase shift film, etching is made by a fluorine-based gas using a gas containing fluorine such as $SF_6$ or $CF_4$ when the phase shift film is patterned, but at the same time, the substrate is slightly etched. Therefore, the phase difference between the portion each with and without phase shift film is different from the phase difference of the film alone. For this reason, there are problems as follows: it is difficult not only to accurately control the phase difference, but also to correct when pattern defects occur.

In order to solve such a problem, a phase shift photomask is possible in which the composition of the phase shift film is made to form a film with different etching characteristics such as a chromium film on the substrate side of the film containing silicon such as MoSi-based films. A chromium film, which is a film that is a light shielding film or an etching mask when etching phase shift film, is generally formed on a film containing silicon, and the chromium film on the substrate side exposed by etching the silicon containing film is etched by chlorine-based gas containing chlorine gas and oxygen gas at the same time as peeling off the chromium shielding film or chromium etching mask on the phase shift film (the side remote from the substrate). However, at this time, side etching of the chromium film on the substrate side easily occurs, and problems such as pattern fall tend to occur. In particular, the amount of side etching increases further when the amount of oxygen and nitrogen is increased in order to increase the transmittance of the chromium film.

The present invention has been made to solve the above problems, and an object is to provide a phase shift mask blank with a phase shift film having good phase control and excellent pattern shape in etching using chlorine-based gas, a phase shift mask, and a method for producing a phase shift mask.

Solution To Problem

To achieve the object, the present invention provides a phase shift mask blank having a transparent substrate and a phase shift film formed on the transparent substrate, comprising, the phase shift film has a phase difference of 160 to 200° and a transmittance of 3 to 15% at exposure wavelength of 200 nm or less, the phase shift film includes a lower layer and an upper layer in order from the transparent substrate side, the upper layer contains transition metal, silicon, nitrogen and/or oxygen, or silicon, nitrogen and/or oxygen, the lower layer contains chromium, silicon, nitrogen and/or oxygen, and the content of silicon is 3% or more to less than 15% for the sum of chromium and silicon in the lower layer, and the ratio of oxygen content to the total content of chromium and silicon is less than 1.7, and etching selectivity of the upper layer is 10 or more compared to the lower layer in fluorine-based dry etching.

With such a phase shift mask blank, it can be a phase shift mask blank that can form a phase shift film having good phase control and excellent pattern shape in etching using chlorine-based gas, for example, chlorine gas and oxygen gas.

Further, it is preferable that the transparent substrate comprises quartz.

Such a material is preferably used as a transparent substrate.

Further, it is preferable that film thickness of the lower layer is 2 to 10 nm, and film thickness of the upper layer is 50 to 80 nm.

When such a configuration is used, a predetermined transmittance is easily obtained.

Further, it is preferable that the transition metal in the upper layer is molybdenum (Mo) and the content of molybdenum (Mo) for the sum of silicon (Si) and molybdenum (Mo) is 20% or less.

In the present invention, the composition of the upper layer can be such a composition.

It is preferable that the phase shift mask blank further comprises a light shielding film containing chromium on the phase shift film, and etching selectivity of the light shielding film is 1.2 or more and 10.0 or less compared to the lower layer in chlorine-based dry etching.

If it is such a light shielding film, it can be removed with the lower layer by dry etching in the chlorine-based gas, and side etching of the lower layer rarely occurs during the process.

It is preferable that it further comprises a hard mask film containing silicon, oxygen, and/or nitrogen on the light shielding film.

In such a hard mask film, since the etching characteristics are different from the light shielding film containing chromium, it is useful as an etching mask in the pattern formation of the light shielding film.

The present invention provides a method for producing a phase shift mask comprising producing a phase shift mask using the above phase shift mask blank.

In such a phase shift mask manufacturing method, a phase shift mask in which not only the transparent substrate is not dug (over-etched), but also the pattern shape is excellent.

In the present invention, the present invention also provides a phase shift mask having a transparent substrate and a phase shift film in which a pattern is formed on the transparent substrate, comprising, the phase shift film has a phase difference of 160 to 200° and a transmittance of 3 to 15% at exposure wavelengths of 200 nm or less, the phase shift film includes a lower layer and an upper layer in order from the transparent substrate side, the upper layer contains transition metal, silicon, nitrogen and/or oxygen, or silicon, nitrogen and/or oxygen, the lower layer contains chromium, silicon, nitrogen and/or oxygen, and the content of silicon is 3% or more to less than 15% for the sum of chromium and silicon in the lower layer, and the ratio of oxygen content to the total content of chromium and silicon is less than 1.7, and etching selectivity of the upper layer is 10 or more compared to the lower layer in fluorine-based dry etching.

The phase shift mask not only suppresses digging (over-etching) to the transparent substrate but also has a good pattern shape.

Further, it is preferable that the transparent substrate comprises quartz.

Such a material is preferably used as a transparent substrate.

Further, it is preferable that film thickness of the lower layer is 2 to 10 nm, and film thickness of the upper layer is 50 to 80 nm.

When such a configuration is used, a predetermined transmittance is easily obtained.

Further, it is preferable that the transition metal in the upper layer is molybdenum (Mo) and the content of molybdenum (Mo) for the sum of silicon (Si) and molybdenum (Mo) is 20% or less.

In the present invention, the composition of the upper layer can be such a composition.

It is preferable that the phase shift mask further comprises a light shielding film containing chromium on the phase shift film, and etching selectivity of the light shielding film is 1.2 or more and 10.0 or less compared to the lower layer in chlorine-based dry etching.

If it is such a light shielding film, it can be removed with the lower layer by dry etching in the chlorine-based gas, and side etching of the lower layer rarely occurs during the process.

Advantageous Effects of Invention

As described above, according to the inventive phase shift mask blank, a photo mask (phase shift mask) having easy adjustability of phase difference and good pattern shape can be manufactured, since digging to the substrate is suppressed when the phase shift film is processed in the processing of the photomask pattern.

BRIEF DESCRIPTION OF THE DRAWINGS

FIG. 1 is a schematic view showing an example of the phase shift mask blank of the present invention.

FIG. 2 is a schematic view showing another example of the phase shift mask blank of the present invention.

FIG. 3 is a schematic view showing still another example of the phase shift mask blank of the present invention.

FIG. 4 is a schematic view of the etching apparatus used in Examples and Comparative Examples.

DESCRIPTION OF EMBODIMENTS

As described above, it is required to develop a phase shift mask blank, a phase shift mask, and a method for manufacturing a phase shift mask, which have good phase controllability and can form a phase shift film having an excellent pattern shape in etching with a chlorine-based gas.

The inventor of the present invention has intensively studied to solve the above-mentioned problems and has found that a photomask having a good pattern with reduced side etching of the lower layer during chlorine-based dry etching for etching a chromium light-shielding film or a chromium etching mask on the phase shift film can be produced by comprising the phase shift film in the following manner, and completed the invention. That is, in the phase shift film having a layer (lower layer) containing chromium, silicon, nitrogen and/or oxygen, and an upper layer containing transition metal, silicon, nitrogen and/or oxygen, or silicon, nitrogen and/or oxygen, the lower layer has silicon content of 3% or more to less than 15% and the ratio of oxygen content to the total content of chromium and silicon is less than 1.7.

That is, the present invention is a phase shift mask blank having a transparent substrate and a phase shift film formed on the transparent substrate. The phase shift film has a phase difference of 160 to 200° and transmittance of 3 to 15% at an exposure wavelength of 200 nm or less. The phase shift film includes a lower layer and an upper layer in order from the transparent substrate side, and the upper layer contains a transition metal, silicon, nitrogen and/or oxygen, or silicon, nitrogen and/or oxygen, and the lower layer contains chromium, silicon, nitrogen and/or oxygen. In the lower layer, silicon content is 3% or more and less than 15% for the sum of chromium and silicon, and the ratio of oxygen content to the total content of chromium and silicon is less than 1.7, and etching selectivity of the upper layer is 10 or more compared to the lower layer in fluorine-based dry etching.

Hereinafter, the present invention will be described in detail, but the present invention is not limited thereto.

<Phase Shift Mask Blank>

The phase shift mask blank of the present invention has a phase shift film formed on a transparent substrate such as a quartz substrate. Further, the phase shift mask of the present invention, which will be described later, has a mask pattern (photomask pattern) of a phase shift film formed on a transparent substrate such as a quartz substrate.

<Transparent Substrate>

In the present invention, the transparent substrate is not particularly limited, but for example, a transparent substrate, a 6 inch square, 0.25 inch thick, called 6025 substrate specified in SEMI standard is suitable. When SI unit system is used, it is usually described as a transparent substrate having a size of 152 mm square and a thickness of 6.35 mm. A quartz substrate is preferable as the transparent substrate.

<Phase Shift Film>

The phase shift film in the present invention has a phase difference of 160 to 200° between lights transmitted through the phase shift film and a portion having no film of the same thickness, and the transmittance is 3 to 15% at an exposure wavelength of 200 nm or less, particularly 193 nm (ArF). The phase shift film comprises a lower layer containing chromium, silicon, nitrogen and/or oxygen, and an upper layer containing and transition metal (preferably the transition metal excluding chromium), silicon, nitrogen and/or oxygen, or silicon, nitrogen and/or oxygen from the transparent substrate side. Further, the content of the silicon in the lower layer containing chromium, silicon, nitrogen and/or oxygen is 3% or more and less than 15% for the sum of chromium and silicon, and the ratio of oxygen content to the total content of chromium and silicon is less than 1.7, and etching selectivity of the upper layer is 10 or more compared to the lower layer in fluorine-based dry etching.

By applying above mentioned structure, a phase sift film in which digging to the transparent substrate does not occur even in dry etching with a fluorine-based gas and side etching is difficult to occur even in dry etching with chlorine-based gas (chlorine-oxygen-based gas) can be obtained. The fluorine-based gas refers to a gas containing fluorine such as $SF_6$ and $CF_4$, and the chlorine-based gas refers to a gas containing chlorine and oxygen such as a gas composed of $Cl_2$ and $O_2$, further He and the like may be included in these gases. Here, dry etching using a fluorine-based gas is called fluorine-based dry etching, and dry etching using chlorine-based gas is called chlorine-based dry etching.

The lower layer contains chromium, silicon, nitrogen and/or oxygen, and silicon content is 3% or more and less than 15% for the sum of chromium and silicon in the lower layer, and the ratio of oxygen content to the total content of chromium and silicon is less than 1.7. Preferably, silicon content in the lower layer is 3% or more and less than 14% for the sum of chromium and silicon in the lower layer, and the ratio of oxygen content to the total content of chromium and silicon is less than 1.6. More preferably, silicon content in the lower layer is 5% or more and less than 10% for the sum of chromium and silicon in the lower layer, and the ratio of oxygen content to the total content of chromium and silicon is less than 1.1. Further, the oxygen content in the lower layer is preferably less than 60%, more preferably less than 50%, and even more preferably less than 45%. On the other hand, it does not have to contain oxygen, but the higher the oxygen content, the higher the transmittance and the easier it is to make adjustments such as making the upper film thinner, so it is preferably 30% or more, more preferably 35% or more, further preferably 40% or more. The nitrogen content is preferably 0% or more and 52% or less. Here, the content of silicon, oxygen, and nitrogen is the ratio of the number of atoms, and can be determined by, for example, measurement by XPS.

The lower layer film is more preferably any of a film composed of chromium, silicon, nitrogen, and oxygen, a film composed of chromium, silicon, and nitrogen, and a film composed of chromium, silicon, and oxygen. These films may further contain carbon, hydrogen and the like.

The upper layer film contains transition metal, silicon, nitrogen and/or oxygen, or silicon, nitrogen and/or oxygen. That is, the upper layer film is more preferably any of a film composed of transition metal, silicon, nitrogen, and oxygen, a film composed of transition metal, silicon, and nitrogen, a film composed of transition metal, silicon, and oxygen, a film composed of silicon, nitrogen and oxygen, a film composed of silicon and nitrogen, and a film composed of silicon and oxygen. These films may further contain carbon, hydrogen and the like.

The transition metal is not particularly limited, but for example, molybdenum, zirconium, tantalum, tungsten, chromium, and titanium can be used, and a transition metal excluding chromium is preferable, and molybdenum is particularly preferable. The ratio of the transition metal to the total composition of the transition metal and silicon is preferably 0% or more and 40% or less, oxygen is preferably 0% or more and 70% or less, and nitrogen is preferably 0% or more and 60% or less. Here, the ratio of the transition metal, oxygen, and nitrogen is the ratio of the number of atoms, and can be obtained by, for example, measurement by XPS.

It is preferable that the thickness of the lower layer containing chromium, silicon, nitrogen and/or oxygen is 2 to 10 nm, and the thickness of the upper layer containing the transition metal, silicon, nitrogen and/or oxygen, or silicon, nitrogen and/or the oxygen is preferably 50 to 80 nm in the phase shift film. With such a configuration, it becomes easy to obtain a predetermined transmittance.

The transition metal in the upper layer containing transition metal, silicon, nitrogen and/or oxygen, or silicon, nitrogen and/or oxygen is preferably molybdenum, and the molybdenum content with respect to the total of silicon and molybdenum is preferably 20% or less.

The layer (upper layer) containing transition metal, silicon, nitrogen and/or oxygen, or silicon, nitrogen and/or oxygen can be etched with fluorine-based etching, and etching selectivity of the upper layer compared to the lower layer in fluorine-based dry etching is preferably 10 or more, and more preferably 15 or more.

Here, the etching selectivity in the fluorine-based dry etching is (etching selectivity)=(etching rate of the upper layer)/(etching rate of the lower layer).

Further, the phase shift film has a light-shielding film containing chromium thereon, which is capable of etching with a chlorine-based gas. And it is preferable that the etching selectivity of the light-shielding film in chlorine-based etching compared to the layer containing chromium, silicon, nitrogen and/or oxygen on the transparent substrate is 1.2 or more and 10.0 or less.

Here, the etching selectivity in the chlorine-based dry etching is (etching selectivity)=(etching rate of the light-shielding film)/(etching rate of the lower layer).

Further, it is preferable to form a hard mask film containing silicon, oxygen, and/or nitrogen on the light-shielding film. Details of the light-shielding film and the hard mask film will be described later.

Here, an example of the phase shift mask blank of the present invention will be described with reference to FIG. 1. In the phase shift mask blank 100 of the present invention, the lower layer 11 which is a layer containing chromium, silicon, nitrogen, and/or oxygen is formed on the transparent substrate 10, and the upper layer 12 containing transition metal, silicon, nitrogen and/or oxygen, or silicon, nitrogen and/or oxygen is formed on the lower layer 11. The phase shift film 1 includes the lower layer 11 and the upper layer 12. Further, the light-shielding film 13 may be formed on the phase shift film 1.

The upper layer 12 is a film that is easily etched by a fluorine-based gas. On the other hand, since the lower layer 11 is a film having the above-mentioned predetermined composition, it is difficult to be etched by the fluorine-based gas, and the lower layer 11 is a film that is etched by the chlorine-based gas at an appropriate rate. Therefore, in manufacturing the phase shift mask from the phase shift mask blank 100, when the upper layer 12 of the phase shift film 1 is peeled off by dry etching with a fluorine-based gas, the transparent substrate 10 is prevented from being dry-etched and dug due to the presence of the lower layer 11. Then, when the unnecessary portion of the light-shielding film 13 is peeled off by the chlorine-based gas, the lower layer 11 is also peeled off at the same time, but since the lower layer 11 has a predetermined composition, side etching does not occur to the lower layer 11.

<Method of Forming a Phase Shift Film>

The phase shift film in the present invention can be formed by applying a known film forming method, but it is preferable to form a film by a sputtering method in which a film having excellent homogeneity can be easily obtained. Any method of sputtering like DC sputtering, RF sputtering or the like can be used, but magnetron sputtering is more preferable. The target and the sputter gas are appropriately selected according to the layer structure and composition.

As a target, when forming the lower layer film containing chromium and silicon, a target composed of chromium and silicon, a co-sputter in which a chromium target and a silicon target are used and discharged at the same time may be used. A co-sputter that discharges simultaneously using a target composed of chromium and silicon as one of the targets instead of the chromium target and the silicon target may be used. A co-sputter that discharges simultaneously using a chromium target, a silicon target, and a target composed of chromium and silicon may also be used.

A silicon target can be used when the upper layer film is a silicon-containing film that does not contain transition metal. When forming a silicon-containing film containing transition metal, a target composed of the transition metal and silicon, a co-sputter in which a transition metal target and a silicon target are used and discharged at the same time may be used. A co-sputter that discharges simultaneously using a target composed of transition metal and silicon as one of the targets instead of the transition metal target and the silicon target may be used. A co-sputter that discharges simultaneously using the transition metal target, the silicon target, and a target composed of transition metal and silicon may also be used.

Further, these targets may contain nitrogen, and a target containing nitrogen and a target containing no nitrogen may be used at the same time.

For adjusting the nitrogen content and oxygen content of the upper and lower layers, nitrogen gas or oxygen gas, or nitrogen oxide containing nitrogen and oxygen is used as the reactive gas as the sputter gas, and the introduction amount is appropriately adjusted for the reactive sputtering. Further, as the sputter gas, helium gas, neon gas, argon gas, krypton gas, xenon gas and the like can be used as the rare gas.

<Second Layer>

A second layer composed of a single layer or a plurality of layers can be formed on the phase shift film of the phase shift mask blank of the present invention. The second layer is usually formed adjacent to the phase shift film. Specific examples of the second layer include a light-shielding film, a combination of a light-shielding film and an antireflection film, and a process-aid film (etching mask film) that functions as a hard mask in pattern formation of the phase shift film. Further, when a third layer described later is formed, this second layer can also be used as a process-aid film (etching stopper film) that functions as an etching stopper in pattern formation of the third layer. As the material of the second layer, a material containing chromium is suitable.

By forming the second layer including the light-shielding film, the phase shift mask can be formed with a region that completely blocks the exposure light. The light-shielding film and the antireflection film can also be used as a process-aid film in etching.

(Light-Shielding Film and Antireflection Film as the Second Layer)

There are many reports on film configurations and materials of the light-shielding film and the antireflection film (for example, Patent Document 2 and Patent Document 3), but as a preferable film composition of combination of the light-shielding film and the antireflection film, examples thereof include those formed with a light-shielding film made of a material containing chromium and further provided with an antireflection film made of a material containing Cr that reduces reflection from the light-shielding film. Both the light-shielding film and the antireflection film may be composed of a single layer or a plurality of layers.

Materials containing chromium for the light-shielding film and the antireflection film include chromium alone, and chromium compounds such as chromium oxide (CrO), chromium nitride (CrN), chromium carbide (CrC), chromium oxynitride (CrON), chromium oxide carbide (CrOC), chromium nitride carbide (CrNC), chromium oxynitride carbide (CrONC) and the like. Here, the chemical formulae representing the material containing chromium indicates the constituent elements, rather than the composition ratio of the constituent elements (the same shall apply to the chromium-containing materials hereinafter).

When the second layer is a light-shielding film or a combination of a light-shielding film and an antireflection film, content of chromium in the chromium compound of the light-shielding film is 40 at % or more, particularly 60 at % or more, and less than 100 at %, preferably 99 at % or less, particularly preferably 90 at % or less. The oxygen content is preferably 60 at % or less, particularly preferably 40 at % or less, and more preferably 1 at % or more. The nitrogen content is preferably 50 at % or less, particularly preferably 40 at % or less, and more preferably 1 at % or more. The carbon content is preferably 20 at % or less, particularly preferably 10 at % or less, and more preferably 1 at % or more when it is necessary to adjust the etching rate. In this case, the total content of chromium, oxygen, nitrogen and carbon is preferably 95 at % or more, particularly 99 at % or more, particularly 100 at %.

When the second layer is a combination of a light-shielding film and an antireflection film, the antireflection film is preferably a chromium compound, and the chromium content in the chromium compound is 30 at % or more, particularly 35 at % or more, preferably 70 at % or less, particularly 50 at % or less. The oxygen content is preferably 60 at % or less, more preferably 1 at % or more, and particularly preferably 20 at % or more. The nitrogen content is preferably 50 at % or less, particularly preferably 30 at % or less, and more preferably 1 at % or more, particularly 3 at % or more. The carbon content is preferably 20 at % or less, particularly 5 at % or less, and more preferably 1 at % or more when it is necessary to adjust the etching rate. In this case, the total content of chromium, oxygen, nitrogen and carbon is preferably 95 at % or more, particularly 99 at % or more, particularly 100 at %.

When the second layer is a light-shielding film or combination of a light-shielding film and an antireflection film, the film thickness of the second layer is usually 20 to 100 nm, preferably 40 to 70 nm. Further, it is preferable that the total optical density of the phase shift film and the second layer with respect to the exposure light having a wavelength of 200 nm or less is 2.0 or more, particularly 2.5 or more, particularly 3.0 or more.

(Process-Aid Film as the Second Layer)

When the second layer is a process-aid film, it can also be used as a process-aid film (etching mask film) that functions as a hard mask in pattern formation of the phase shift film, or a process-aid film that functions as an etching stopper (etching stopper film) in pattern formation of the third layer. Examples of the process-aid film include a film made of a material containing chromium as shown in Patent Document 4. The process-aid film may be composed of a single layer or a plurality of layers.

Materials containing chromium in the process-aid film include chromium alone, and chromium compounds such as chromium oxide (CrO), chromium nitride (CrN), chromium carbide (CrC), chromium oxynitride (CrON), chromium oxide carbide (CrOC), chromium carbide nitride (CrNC) and chromium oxynitride carbide (CrONC).

When the second layer is a process-aid film, the content of Cr in the Cr compound of the second layer is 40 at % or more, particularly 50 at % or more, 100 at % or less, preferably 99 at % or less, particularly 90 at % or less. The oxygen content is preferably 60 at % or less, particularly 55 at % or less, and more preferably 1 at % or more when it is necessary to adjust the etching rate. The nitrogen content is preferably 50 at % or less, particularly preferably 40 at % or less, and more preferably 1 at % or more. The carbon content is preferably 20 at % or less, particularly preferably 10 at % or less, and more preferably 1 at % or more when it is necessary to adjust the etching rate. In this case, the total content of chromium, oxygen, nitrogen and carbon is preferably 95 at % or more, particularly 99 at % or more, particularly 100 at %.

<Third Layer>

A third layer composed of a single layer or a plurality of layers can be formed on the second layer of the phase shift mask blank of the present invention. The third layer is usually formed adjacent to the second layer. Specific examples of the third layer include a process-aid film, a light-shielding film, and a combination of a light-shielding film and an antireflection film. As the material of the third layer, a material containing silicon is preferable, and a material containing no chromium is particularly preferable.

Specific examples of such a phase shift mask blank include those shown in FIG. 2. FIG. 2 is a cross-sectional view showing an example of the phase shift mask blank of the present invention. The phase shift mask blank 100 includes a transparent substrate 10, a phase shift film 1 formed on the transparent substrate 10, a second layer 2 formed on the phase shift film 1, and a third layer 3 formed on the second layer 2.

(Process-Aid Film as the Third Layer)

When the second layer is a light-shielding film or a combination of a light-shielding film and an antireflection film, or a process-aid film that functions as a hard mask in pattern formation of the halftone phase shift film, as the third layer, a process-aid film (etching mask film) that functions as a hard mask in pattern formation of the second layer can be provided. Further, when the fourth layer described later can be provided, the third layer can also be used as a process-aid film (etching stopper film) that functions as an etching stopper in pattern formation of the fourth layer.

This process-aid film preferably comprises a material having etching characteristics different from that of the second layer, for example, a material having resistance to chlorine-based dry etching applied to etching a material containing chromium, specifically, a material containing silicon that can be etched with a fluorine-based gas such as $SF_6$ and $CF_4$.

Examples of the silicon containing material include silicon (simple substance), and a silicon compound such as a material containing silicon, and either or both of nitrogen and oxygen, a material containing silicon and a transition metal, and a material containing silicon, either or both of nitrogen and oxygen, and a transition metal. Examples of the transition metal include molybdenum, tantalum and zirconium or the like.

When the third layer is a process-aid film, the process-aid film is preferably a silicon compound, and the content of silicon in the silicon compound is 20 at % or more, particularly 33 at % or more, and 95 at % or less. In particular, it is preferably 80 at % or less. The nitrogen content is preferably 50 at % or less, particularly preferably 30 at % or less, and more preferably 1 at % or more. The oxygen content is preferably 70 at % or less, particularly 66 at % or less, and preferably 1 at % or more, and more preferably 20 at % or more when it is necessary to adjust the etching rate. The transition metal may or may not be contained. When the transition metal is contained, the content thereof is preferably 35 at % or less, particularly 20 at % or less. In this case, the total content of silicon, oxygen, nitrogen and the transition metal is preferably 95 at % or more, particularly 99 at % or more, particularly 100 at %.

When the second layer is a light-shielding film or a combination of a light-shielding film and an antireflection film and the third layer is a process-aid film, the film thickness of the second layer is usually 20 to 100 nm, preferably 40 to 70 nm. The film thickness of the third layer is usually 1 to 30 nm, preferably 2 to 15 nm. Further, the total optical density of the phase shift film and the second layer and the third layer with respect to the exposure light having a wavelength of 200 nm or less is preferably 2.0 or more, particularly 2.5 or more, more particularly 3.0 or more.

On the other hand, when the second layer is a process-aid film and the third layer is a process-aid film, the film thickness of the second layer is usually 1 to 20 nm, preferably 2 to 10 nm, and the film thickness of the third layer is usually 1 to 20 nm, preferably 2 to 10 nm.

(Light-Shielding Film and Antireflection Film as the Third Layer)

Further, when the second layer is a process-aid film, a light-shielding film can be formed as the third layer. Further, as the third layer, a light-shielding film and an antireflection film may be provided in combination.

The light-shielding film and the antireflection film of the third layer are materials having etching characteristics different from the second layer, for example, a material having resistance to chlorine-based dry etching applied to etching a material containing chromium, specifically, it is preferable to use a material containing silicon that can be etched with a fluorine-based gas such as $SF_6$ or $CF_4$.

Examples of the silicon containing material include silicon (simple substance), and a silicon compound such as a material containing silicon, and either or both of nitrogen and oxygen, a material containing silicon and a transition metal, and a material containing silicon, either or both of nitrogen and oxygen, and transition metal. Examples of the transition metal include molybdenum, tantalum and zirconium or the like.

When the third layer is a light-shielding film or a combination of a light-shielding film and an antireflection film, the light-shielding film and the antireflection film are preferably silicon compounds, and the content of silicon in the silicon compound is preferably 10 at % or more, in particular, 30 at % or more and less than 100 at %, particularly 95 at % or less. The nitrogen content is preferably 50 at % or less, particularly preferably 40 at % or less, particularly 20 at % or less, and more preferably 1 at % or more when it is necessary to adjust the etching rate. The oxygen content is preferably 60 at % or less, particularly 30 at % or less, and preferably 1 at % or more when it is necessary to adjust the etching rate. The content of the transition metal is preferably 35 at % or less, particularly 20 at % or less, and more preferably 1 at % or more. In this case, the total content of silicon, oxygen, nitrogen and the transition metal is preferably 95 at % or more, particularly 99 at % or more, particularly 100 at %.

When the second layer is a process-aid film and the third layer is a light-shielding film, or a combination of a light-shielding film and an antireflection film, the film thickness of the second layer is usually 1 to 20 nm, preferably 2 to 10 nm. The film thickness of the third layer is usually 20 to 100 nm, preferably 30 to 70 nm. Further, the total optical density of the phase shift film and the second layer and the third layer with respect to the exposure light having a wavelength of 200 nm or less is preferably 2.0 or more, particularly 2.5 or more, more particularly 3.0 or more.

<Fourth Layer>

A fourth layer composed of a single layer or a plurality of layers can be formed on the third layer of the phase shift mask blank of the present invention. The fourth layer is usually formed adjacent to the third layer. Specific examples of the fourth layer include a process-aid film that functions as a hard mask in pattern formation of the third layer. As the material of the fourth layer, a material containing chromium is suitable.

Specific examples of such a phase shift mask blank include those shown in FIG. 3. FIG. 3 is a cross-sectional view showing an example of the phase shift mask blank of the present invention. The phase shift mask blank 100 includes a transparent substrate 10, a phase shift film 1 formed on the transparent substrate 10, a second layer 2 formed on the phase shift film 1, a third layer 3 formed on the second layer 2, and a fourth layer 4 formed on the third layer 3.

(Process-Aid Film as the Fourth Layer)

When the third layer is a light-shielding film or a combination of a light-shielding film and an antireflection film, a process-aid film (etching mask film) that functions as a hard mask in pattern formation of the third layer as the fourth layer can be formed.

This process-aid film is a material having etching characteristics different from that of the third layer, for example, a material having resistance to fluorine-based dry etching applied to etching a material containing silicon, specifically, it is preferable to use a material containing chromium that can be etched with a chlorine-based gas containing oxygen.

Specific examples of the material containing chromium include chromium alone, and chromium compounds such as chromium oxide (CrO), chromium nitride (CrN), chromium carbide (CrC), chromium oxynitride (CrON), chromium oxide carbide (CrOC), chromium carbide nitride (CrNC) and chromium oxynitride carbide (CrONC).

When the fourth layer is a process-aid film, the content of chromium in the fourth layer is preferably 30 at % or more, particularly 40 at % or more, 100 at % or less, preferably 99 at % or less, particularly 90 at % or less. The oxygen content is preferably 60 at % or less, particularly 40 at % or less, and more preferably 1 at % or more when it is necessary to adjust the etching rate. The nitrogen content is preferably 50 at % or less, particularly 40 at % or less, and more preferably 1 at % or more when it is necessary to adjust the etching rate. The carbon content is preferably 20 at % or less, particularly preferably 10 at % or less, and more preferably 1 at % or more when it is necessary to adjust the etching rate. In this case, the total content of chromium, oxygen, nitrogen and carbon is preferably 95 at % or more, particularly 99 at % or more, particularly 100 at %.

When the second layer is a process-aid film, the third layer is a light-shielding film, or a combination of a light-shielding film and an antireflection film, and the fourth layer is a process-aid film, the film thickness of the second layer is usually 1 to 20 nm, preferably 2 to 10 nm. The film thickness of the third layer is usually 20 to 100 nm, preferably 30 to 70 nm, and the film thickness of the fourth layer is usually 1 to 30 nm, preferably 2 to 20 nm. Further, the total optical density of the phase shift film, the second layer, the third layer, and the fourth layer with respect to the exposure light having a wavelength of 200 nm or less is preferably 2.0 or more, particularly 2.5 or more, more particularly 3.0 or more.

<Method of Forming the Second to Fourth Layers>

The films composed of the chromium-containing material of the second layer and the fourth layer can be formed by reactive sputtering. A chromium target, a target obtained by adding any one or more selected from oxygen, nitrogen and carbon to chromium, and the like are used. A sputter gas obtained by appropriately adding a reactive gas selected from oxygen-containing gas, nitrogen-containing gas, carbon-containing gas, etc. to a rare gas such as Ar, He, Ne, depending on the composition of the film to be formed can be used.

On the other hand, the film made of the silicon-containing material of the third layer can be formed by reactive sputtering. A silicon target, a silicon nitride target, a target containing both silicon and silicon nitride, a transition metal target, a composite target of silicon and a transition metal, and the like are used. A sputter gas obtained by appropriately adding a reactive gas selected from oxygen-containing gas, nitrogen-containing gas, carbon-containing gas, etc. to a rare gas such as Ar, He, Ne, depending on the composition of the film to be formed can be used.

<Manufacturing Method of Phase Shift Mask>

Further, the present invention provides a method for manufacturing a phase shift mask, which manufactures a phase shift mask using the above-mentioned phase shift mask blank. The phase shift mask of the present invention can be produced from the phase shift mask blank of the present invention by a conventional method. Specific examples of the method for manufacturing the phase shift mask of the present invention are shown below.

SPECIFIC EXAMPLE 1

In a phase shift mask blank in which a film of a material containing chromium is formed as a second layer on the phase shift film, for example, the phase shift mask can be manufactured by the following steps.

First, an electron beam resist film is formed on the second layer of the phase shift mask blank, a pattern is drawn by the electron beam, and then a resist pattern is obtained by a predetermined development operation. Next, the obtained resist pattern is used as an etching mask, and the resist pattern is transferred to the second layer by chlorine-based dry etching containing oxygen, to obtain a second layer pattern. Next, the obtained second layer pattern is used as an etching mask, and the second layer pattern is transferred to the upper layer of the phase shift film by fluorine-based dry etching, to obtain a phase shift film pattern. Then, the second layer and the exposed lower layer of the phase shift film are removed by chlorine-based dry etching containing oxygen to obtain a phase shift mask. Here, when it is necessary to leave a part of the second layer, a resist pattern for protecting the part is formed on the second layer, and then the resist pattern is subjected to chlorine-based dry etching containing oxygen. The second layer of the portion not protected by the resist pattern and the exposed lower layer of the phase shift film are removed. Then, the resist pattern can be removed by a conventional method to obtain a phase shift mask.

SPECIFIC EXAMPLE 2

Further, in a phase shift mask blank in which a light-shielding film of a material containing chromium or a combination of a light-shielding film and an antireflection film is formed as a second layer on the phase shift film, and as a third layer on the second layer, the process-aid film of the material containing silicon is formed, for example, the phase shift mask can be manufactured by the following steps.

First, an electron beam resist film is formed on the third layer of the phase shift mask blank, a pattern is drawn by the electron beam, and then a resist pattern is obtained by a predetermined development operation. Next, the obtained resist pattern is used as an etching mask, and the resist pattern is transferred to the third layer by fluorine-based dry etching to obtain a third layer pattern. Next, the obtained third layer pattern is used as an etching mask, and the third layer pattern is transferred to the second layer by chlorine-based dry etching containing oxygen, to obtain second layer pattern. Next, after removing the resist pattern, the pattern of the second layer is transferred to the upper layer of the phase shift film by fluorine-based dry etching using the obtained pattern of the second layer as an etching mask, to obtain phase shift film pattern. At the same time as obtaining the pattern, the pattern of the third layer is removed. Next, a resist pattern that protects the portion where the second layer remains is formed on the second layer, and then the second layer of the portion that is not protected by the resist pattern and the exposed lower layer of the phase shift film are subjected to chlorine-based dry etching containing oxygen to remove them. Then, the resist pattern can be removed by a conventional method to obtain a phase shift mask.

SPECIFIC EXAMPLE 3

On the other hand, in a phase shift mask blank in which a process-aid film of a material containing chromium is formed as a second layer on a phase shift film, and a light-shielding film of a material containing silicon or the combination of the light-shielding film and an antireflection film is formed on the second layer as a third layer, for example, the phase shift mask can be manufactured by the following steps.

First, an electron beam resist film is formed on the third layer of the phase shift mask blank, a pattern is drawn by the electron beam, and then a resist pattern is obtained by a predetermined development operation. Next, the obtained resist pattern is used as an etching mask, the resist pattern is transferred to the third layer by fluorine-based dry etching to obtain a third layer pattern. Next, the obtained pattern of the third layer is used as an etching mask, the pattern of the third layer is transferred to the second layer by chlorine-based dry etching containing oxygen to obtain a second layer pattern in which the second layer has been removed in the portion where the phase shift film is supposed to be removed. Next, after removing resist pattern, and forming a resist pattern on the third layer to protect the portion of the third layer to be remained, the pattern of the second layer is transferred to the upper layer of the phase shift film by fluorine-based dry etching using the obtained pattern of the second layer as an etching mask, to obtain a phase shift film pattern. At the same time, the third layer of the portion not protected by the resist pattern is removed. Next, the resist pattern is removed by a conventional method. Then, the phase shift mask can be obtained by removing the portion of the second layer from which the third layer has been removed and the exposed lower layer of the phase shift film by chlorine-based dry etching containing oxygen.

SPECIFIC EXAMPLE 4

Further, in a phase shift mask blank in which a process-aid film of a material containing chromium is formed as a second layer on the phase shift film, and a light-shielding film of a material containing silicon or combination of a light-shielding film and an antireflection film is formed as a third layer on the second layer, and a process-aid film of a material containing chromium is further formed as a fourth layer on the third layer, for example, a phase shift mask can be manufactured by the following process.

First, an electron beam resist film is formed on the fourth layer of the phase shift mask blank, a pattern is drawn by the electron beam, and then a resist pattern is obtained by a predetermined development operation. Next, the obtained resist pattern is used as an etching mask, the resist pattern is transferred to the fourth layer by chlorine-based dry etching containing oxygen to obtain the pattern of the fourth layer. Next, the obtained pattern of the fourth layer is used as an etching mask, the pattern of the fourth layer is transferred to the third layer by fluorine-based dry etching to obtain the pattern of the third layer. Next, after removing the resist pattern and forming a resist pattern to protect the portion of the third layer to be remained on the fourth layer, the pattern of the third layer is transferred to the second layer to obtain the pattern of the second layer by the chlorine-based dry etching containing oxygen using the obtained pattern of the third layer as an etching mask. At the same time, the fourth layer of the portion not protected by the resist pattern is removed. Next, the pattern of the second layer is used as an etching mask, the pattern of the second layer is transferred to the upper layer of the phase shift film by fluorine-based dry etching to obtain the phase shift film pattern and at the same time the portion of the third layer not protected with the resist pattern is removed. Next, the resist pattern is removed by a conventional method. Then, a phase shift mask can be obtained by removing the portion of the second layer from which the third layer has been removed, the portion of the fourth layer from which the resist pattern has been removed, and the exposed lower layer of the phase shift film by chlorine-based dry etching containing oxygen.

<Phase Shift Mask>

The present invention also provides a phase shift mask. The phase shift mask of the present invention has a transparent substrate and a phase shift film in which a pattern is formed on the transparent substrate, and the transparent substrate and the phase shift film are as described above. Further, a light-shielding film containing chromium may be provided on the phase shift film.

The phase shift mask (halftone phase shift type photomask) of the present invention is particularly effective in exposure in which a pattern is transferred to the photoresist film formed on a substrate to be processed with an exposure light having a wavelength of 250 nm or less, particularly a wavelength of 200 nm or less, such as ArF excimer laser light (wavelength 193 nm) and $F_2$ laser light (wavelength 157 nm), for forming a pattern having a half pitch of 50 nm or less, particularly 30 nm or less, particularly 20 nm or less, on the substrate to be processed in photolithography.

EXAMPLE

Hereinafter, the present invention will be specifically described with reference to Examples and Comparative Examples, but the present invention is not limited thereto.

Example 1

A 152 mm square, 6.35 mm thick 6025 quartz substrate is placed in a chamber of a sputtering apparatus, a chromium target and a silicon target are used as sputtering targets, and argon gas, nitrogen gas, and oxygen gas are used as sputtering gases, and a layer composed of CrSiON was formed with a film thickness of 5 nm. Next, the substrate on which the above CrSiON is formed is placed in a chamber of another sputtering apparatus, and a MoSi target and a silicon target are used as sputtering targets, and argon gas, nitrogen gas, and oxygen gas are used as sputtering gases, and a layer composed of MoSiON is formed with a film thickness of 71 nm. Then the phase difference and the transmittance of the two layers composed of CrSiON and MoSiON were measured, the phase difference was 180 deg and the transmittance was 6.0%.

Next, the composition of each layer was measured by XPS, the CrSiON layer contained 41% chromium, 2% silicon, 13% nitrogen, and 44% oxygen, and the MoSiON layer contained 7% molybdenum, 38% silicon, 40% nitrogen and 15% oxygen. That is, the silicon content to the total of chromium and silicon in the lower layer was 5%, and the ratio of the oxygen content to the total content of chromium and silicon was 1.0.

Next, a light-shielding film made of CrON was formed in a sputtering apparatus with a film thickness of 48 nm so that the OD at the exposure light of 193 nm was 3 or more on the phase shift film composed of the two layers of the CrSiON layer and the MoSiON layer.

Next, each layer of the photomask blank obtained was etched with a Cl-based gas and was etched with an F-based gas in a dry etching apparatus, the etching rate of each layer was calculated, and the selectivity among each layer was confirmed. The selectivity of F-based dry etching between the CrSiON layer and the MoSiON layer on the quartz substrate was 30, and the selectivity of Cl-based dry etching between the CrSiON layer and the CrON light-shielding layer was 3.5.

FIG. 4 shows an outline of the dry etching apparatus used. The dry etching apparatus 1000 includes a chamber 101, a ground 102, a lower electrode 103, an antenna coil 104, and high frequency power supplies RF1 and RF2, and a substrate 105 to be processed is placed on the lower electrode 103.

Next, using the obtained photomask blank, a resist is applied and a pattern is drawn, and after a resist peeling and a fluorine-based or Cl-based dry etching process of each layer, a photomask having a line-and-space pattern with a line width of 200 nm was obtained. The obtained pattern portion was cut and the cross-sectional shape of the pattern portion was observed and confirmed with a scanning microscope, the amount of side etching of the CrSiON layer on the quartz substrate was small, and a good shape was maintained.

<Fluorine-Based Dry Etching Conditions>
RF1 (RIE: reactive ion etching): CW (continuous discharge) 54 W
RF2 (ICP: inductively coupled plasma): CW (continuous discharge) 325 W
Pressure: 5 mTorr
$SF_6$: 18 sccm
$O_2$: 45 sccm
<Cl-Based Dry Etching Conditions>
RF1 (RIE: reactive ion etching): CW (continuous discharge) 700V
RF2 (ICP: inductively coupled plasma): CW (continuous discharge) 400 W
Pressure: 6 mTorr
$Cl_2$: 185 sccm
$O_2$: 55 sccm
He: 9.25 sccm

Example 2

A 152 mm square, 6.35 mm thick 6025 quartz substrate was placed in the chamber of the sputtering apparatus, and a layer composed of CrSiON was formed with a film thickness of 5 nm in the same manner as in Example 1 except for the applied power applied to the Cr target and the Si target. Next, a layer composed of MoSiON was formed with a film thickness of 70 nm in the same manner as in Example 1. When the phase difference and the transmittance of the two layers composed of CrSiON and MoSiON were measured, the phase difference was 180 deg and the transmittance was 6.0%.

Next, the composition of each layer was measured by XPS, the CrSiON layer contained 42.5% chromium, 1.5% silicon, 14% nitrogen, and 42% oxygen, and the MoSiON layer contained 7% Mo, 38% Si, 40% nitrogen, and 15% oxygen. That is, the silicon content to the total of chromium and silicon in the lower layer was 3%, and the ratio of the oxygen content to the total content of chromium and silicon was 1.0.

Next, a light-shielding film made of CrON was formed in a sputtering apparatus with a film thickness of 48 nm so that the OD at the exposure light of 193 nm was 3 or more on the phase shift film composed of the two layers of the CrSiON layer and the MoSiON layer.

Next, each layer of the photomask blank obtained was etched with a Cl-based gas and was etched with an F-based gas in a dry etching apparatus, the etching rate of each layer was calculated, and the selectivity among each layer was confirmed. The selectivity of F-based dry etching between the CrSiON layer and the MoSiON layer on the quartz substrate was 32, and the selectivity of Cl-based dry etching between the CrSiON layer and the CrON light-shielding layer was 2.0.

When a line-and-space pattern having a line width of 200 nm was produced in the same manner as in Example 1 and the cross-sectional shape of the pattern portion was confirmed, the pattern portion was good.

Example 3

A 152 mm square, 6.35 mm thick 6025 quartz substrate was placed in a chamber of a sputtering apparatus, and a layer made of CrSiON was formed with a film thickness of 5 nm in the same manner as in Example 1. Next, a Si target was installed in the chamber of the sputtering apparatus, argon gas and nitrogen gas were used as the sputtering gas, and a layer made of SiN was formed with a film thickness of 63 nm. When the phase difference and the transmittance of the two layers composed of CrSiON and SiN were measured, the phase difference was 180 deg and the transmittance was 6.0%.

Next, the composition of each layer was measured by XPS, the CrSiON layer contained 42.5% chromium, 1.5% silicon, 14% nitrogen, and 42% oxygen, and the SiN layer contained 45% silicon and 55% nitrogen. That is, the silicon content to the total of chromium and silicon in the lower layer was 3%, and the ratio of the oxygen content to the total content of chromium and silicon was 1.0.

Next, a light-shielding film made of CrON was formed in a sputtering apparatus with a film thickness of 48 nm so that the OD at the exposure light of 193 nm was 3 or more on the phase shift film composed of two layers of CrSiON layer and SiN layer.

Next, each layer of the photomask blank obtained was etched with a Cl-based gas and was etched with an F-based gas in a dry etching apparatus, the etching rate of each layer was calculated, and the selectivity of each layer was confirmed. The selectivity of F-based dry etching between the CrSiON layer and the SiN layer on the quartz substrate was 12, and the selectivity of Cl-based dry etching between the CrSiON layer and the CrON light-shielding layer was 2.0.

When a line-and-space pattern having a line width of 200 nm was produced in the same manner as in Example 1 and the cross-sectional shape of the pattern portion was confirmed, the pattern portion was good.

Example 4

A 152 mm square, 6.35 mm thick 6025 quartz substrate was placed in a chamber of a sputtering apparatus, and a layer made of CrSiON was formed with a film thickness of 5 nm in the same manner as in Example 1 except that a chromium target was used. Next, a layer made of MoSiON was formed with a film thickness of 73 nm in the same manner as in Example 1. When the phase difference and the transmittance of the two layers composed of CrSiON and MoSiON were measured, the phase difference was 180 deg and the transmittance was 6.0%.

Next, the composition of each layer was measured by XPS, the CrSiON layer contained 35.5% chromium, 5.5% silicon, 10% nitrogen, and 49% oxygen, and the MoSiON layer contained 7% Mo and 38% Si, 40% nitrogen, and 15% oxygen. That is, the silicon content to the total of chromium and silicon in the lower layer was 13%, and the ratio of the oxygen content to the total content of chromium and silicon was 1.2.

Next, a light-shielding film made of CrON was formed in a sputtering apparatus with a film thickness of 48 nm so that the OD at the exposure light of 193 nm was 3 or more on the phase shift film composed of the two layers of the CrSiON layer and the MoSiON layer.

Next, each layer of the photomask blank obtained was etched with a Cl-based gas and was etched with an F-based gas in a dry etching apparatus, the etching rate of each layer was calculated, and the selectivity of each layer was confirmed. The selectivity of F-based dry etching between the CrSiON layer and the MoSiON layer on the quartz substrate was 28, and the selectivity of Cl-based dry etching between the CrSiON layer and the CrON light-shielding layer was 10.

When a line-and-space pattern having a line width of 200 nm was produced in the same manner as in Example 1 and the cross-sectional shape of the pattern portion was confirmed, the pattern portion was good.

Example 5

A 152 mm square, 6.35 mm thick 6025 quartz substrate was placed in a chamber of a sputtering apparatus, and a layer made of CrSiON was formed with a film thickness of 5 nm in the same manner as in Example 1 except that a chromium target was used. Next, a layer made of MoSiON was formed with a film thickness of 73 nm in the same manner as in Example 1. When the phase difference and the transmittance of the two layers composed of CrSiON and MoSiON were measured, the phase difference was 180 deg and the transmittance was 6.0%.

Next, the composition of each layer was measured by XPS, the CrSiON layer contained 36% chromium, 3% silicon, 2% nitrogen, and 59% oxygen, and the MoSiON layer contained 7% Mo and 38% Si, 40% nitrogen and 15% oxygen. That is, the silicon content to the total of chromium and silicon in the lower layer was 8%, and the ratio of the oxygen content to the total content of chromium and silicon was 1.5.

Next, a light-shielding film made of CrON was formed in a sputtering apparatus with a film thickness of 48 nm so that the OD at the exposure light of 193 nm was 3 or more on the phase shift film composed of the two layers of the CrSiON layer and the MoSiON layer.

Next, each layer of the photomask blank obtained was etched with a Cl-based gas and was etched with an F-based gas in a dry etching apparatus, the selectivity of each layer was calculated, and the selectivity of each layer was confirmed. The selectivity of F-based dry etching between the CrSiON layer and the MoSiON layer on the quartz substrate was 10, and the selectivity of Cl-based dry etching between the CrSiON layer and the CrON light-shielding layer was 5.

When a line-and-space pattern having a line width of 200 nm was produced in the same manner as in Example 1 and the cross-sectional shape of the pattern portion was confirmed, the pattern portion was good. The selectivity of F-based etching of this film is 10, and if more oxygen is added than this, the resistance to F-based etching becomes too low, and the function as a stopper deteriorates.

Comparative Example 1

A 152 mm square, 6.35 mm thick 6025 quartz substrate was placed in a chamber of a sputtering apparatus, and a layer made of CrON was formed with a film thickness of 5 nm in the same manner as in Example 1 except that a chrome target was used. Next, a layer made of MoSiON was formed with a film thickness of 73 nm in the same manner as in Example 1. When the phase difference and transmittance of the two layers composed of CrON and MoSiON were measured, the phase difference was 180 deg and the transmittance was 6.0%.

Next, the composition of each layer was measured by XPS, the CrON layer contained 43% chromium, 14.5% nitrogen, and 42.5% oxygen, and the MoSiON layer contained 7% Mo and 38% Si, 40% nitrogen and 15% oxygen. That is, the silicon content to the total of chromium and silicon in the lower layer was 0%, and the ratio of the oxygen content to the total content of chromium and silicon was 1.0.

Next, a light-shielding film made of CrON was formed in a sputtering apparatus with a film thickness of 48 nm so that the OD at the exposure light of 193 nm was 3 or more on the phase shift film composed of two layers of the CrON layer and the MoSiON layer.

Next, each layer of the photomask blank obtained was etched with a Cl-based gas and was etched with an F-based gas in a dry etching apparatus, the etching rate of each layer was calculated, and the selectivity of each layer was confirmed. The selectivity of F-based dry etching between the CrON layer and the MoSiON layer on the quartz substrate was 33, and the selectivity of Cl-based dry etching between the CrON layer and the CrON light-shielding layer was 1.0.

A line-and-space pattern having a line width of 200 nm was produced in the same manner as in Example 1, and the cross-sectional shape of the pattern portion was confirmed. Side etching to the pattern portion of the CrON layer on the quartz substrate occurred and the cross sectional shape was not good. This is a result of the fact that the lower layer of the phase shift film did not contain silicon, so that the etching rate in the Cl-based dry etching of the lower layer became too high.

Comparative Example 2

A 152 mm square, 6.35 mm thick 6025 quartz substrate was placed in a chamber of a sputtering apparatus, and a layer made of CrSiON was formed with a film thickness of 5 nm in the same manner as in Example 1 except that the flow rate of oxygen gas introduced into the chamber was increased. Next, a layer made of MoSiON was formed with a film thickness of 69 nm in the same manner as in Example 1. When the phase difference and the transmittance of the two layers composed of CrSiON and MoSiON were measured, the phase difference was 180 deg and the transmittance was 6.0%.

Next, the composition of each layer was measured by XPS, the CrSiON layer contained 33% chromium, 4% silicon, 1% nitrogen, and 62% oxygen, and the MoSiON layer contained 7% molybdenum and 38% silicon, 40% nitrogen and 15% oxygen. That is, the silicon content to the total of chromium and silicon in the lower layer was 11%, and the ratio of the oxygen content to the total content of chromium and silicon was 1.7.

Next, a light-shielding film made of CrON was formed in a sputtering apparatus with a film thickness of 48 nm so that the OD at the exposure light of 193 nm was 3 or more on the phase shift film composed of the two layers of the CrSiON layer and the MoSiON layer.

Next, each layer of the photomask blank obtained was etched with a Cl-based gas and was etched with an F-based gas in a dry etching apparatus, the etching rate of each layer was calculated, and the selectivity of each layer was confirmed. The selectivity of F-based dry etching between the CrSiON layer and the MoSiON layer on the quartz substrate was 0.5 or less, and the selectivity of Cl-based dry etching between the CrSiON layer and the CrON light-shielding layer was 3.0.

When a line-and-space pattern having a line width of 200 nm was produced in the same manner as in Example 1 and the cross-sectional shape of the pattern portion was confirmed, digging (over-etching) occurred into the quartz substrate. In the CrSiON film (lower layer) having a high oxygen content, the etching rate in F-based etching becomes too fast, and the etching proceeds to the quartz portion.

Comparative Example 3

A 152 mm square, 6.35 mm thick 6025 quartz substrate was placed in a chamber of a sputtering apparatus, and a layer made of CrSiON was formed with a film thickness of 5 nm in the same manner as in Example 1 except for the applied power applied to the Cr target and the Si target. Next, a layer made of MoSiON was formed with a film thickness of 69 nm in the same manner as in Example 1. When the phase difference and the transmittance of the two layers composed of CrSiON and MoSiON were measured, the phase difference was 180 deg and the transmittance was 6.0%.

Next, the composition of each layer was measured by XPS, the CrSiON layer contained 32% chromium, 7% silicon, 4% nitrogen, and 57% oxygen, and the MoSiON layer contained 7% molybdenum and 38% silicon, 40% nitrogen and 15% oxygen. That is, the silicon content to the total of chromium and silicon in the lower layer was 18%, and the ratio of the oxygen content to the total content of chromium and silicon was 1.5.

Next, a light-shielding film made of CrON was formed in a sputtering apparatus with a film thickness of 48 nm so that the OD at the exposure light of 193 nm was 3 or more on the phase shift film composed of the two layers of the CrSiON layer and the MoSiON layer.

Next, each layer of the photomask blank obtained was etched with a Cl-based gas and was etched with an F-based gas in the dry etching apparatus, the etching rate of each layer was calculated, and the selectivity of each layer was confirmed. The selectivity of F-based dry etching between the CrSiON layer and the MoSiON layer on the quartz substrate is 12, and for Cl-based dry etching between the CrSiON layer and the CrON light-shielding layer, the CrSiON film (lower layer) with a high Si content could not be peeled off by chlorine-based etching and the selectivity could not be calculated.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A phase shift mask blank having a transparent substrate and a phase shift film formed on the transparent substrate, comprising,
    the phase shift film has a phase difference of 160 to 200° and a transmittance of 3 to 15% at exposure wavelength of 200 nm or less,
    the phase shift film includes a lower layer and an upper layer in order from the transparent substrate side,
    the upper layer contains transition metal, silicon, nitrogen and/or oxygen, or silicon, nitrogen and/or oxygen,
    the lower layer contains chromium, silicon, nitrogen and/or oxygen, and the content of silicon is 3% or more to less than 15% for the sum of chromium and silicon in the lower layer, and the ratio of oxygen content to the total content of chromium and silicon is less than 1.7, and
    etching selectivity of the upper layer is 10 or more compared to the lower layer in fluorine-based dry etching.

2. The phase shift mask blank according to claim 1, wherein the transparent substrate comprises quartz.

3. The phase shift mask blank according to claim 1, wherein the film thickness of the lower layer is 2 to 10 nm and the film thickness of the upper layer is 50 to 80 nm.

4. The phase shift mask blank according to claim 2, wherein the film thickness of the lower layer is 2 to 10 nm and the film thickness of the upper layer is 50 to 80 nm.

5. The phase shift mask blank according to claim 1, wherein the transition metal in the upper layer is molybdenum (Mo) and the content of molybdenum (Mo) for the sum of silicon (Si) and molybdenum (Mo) is 20% or less.

6. The phase shift mask blank according to claim 2, wherein the transition metal in the upper layer is molybdenum (Mo) and the content of molybdenum (Mo) for the sum of silicon (Si) and molybdenum (Mo) is 20% or less.

7. The phase shift mask blank according to claim 3, wherein the transition metal in the upper layer is molybdenum (Mo) and the content of molybdenum (Mo) for the sum of silicon (Si) and molybdenum (Mo) is 20% or less.

8. The phase shift mask blank according to claim 4, wherein the transition metal in the upper layer is molybdenum (Mo) and the content of molybdenum (Mo) for the sum of silicon (Si) and molybdenum (Mo) is 20% or less.

9. The phase shift mask blank according to claim 1, wherein further comprising a light shielding film containing chromium on the phase shift film, and etching selectivity of the light shielding film is 1.2 or more and 10.0 or less compared to the lower layer in chlorine-based dry etching.

10. The phase shift mask blank according to claim 9, wherein further comprising a hard mask film containing silicon, oxygen, and/or nitrogen on the light shielding film.

11. A method for producing a phase shift mask comprising producing a phase shift mask using the phase shift mask blank according to claim 1.

12. A phase shift mask having a transparent substrate and a phase shift film in which a pattern is formed on the transparent substrate,
comprising,
the phase shift film has a phase difference of 160 to 200° and a transmittance of 3 to 15% at exposure wavelengths of 200 nm or less,
the phase shift film includes a lower layer and an upper layer in order from the transparent substrate side,
the upper layer contains transition metal, silicon, nitrogen and/or oxygen, or silicon, nitrogen and/or oxygen,
the lower layer contains chromium, silicon, nitrogen and/or oxygen, and the content of silicon is 3% or more to less than 15% for the sum of chromium and silicon in the lower layer, and the ratio of oxygen content to the total content of chromium and silicon is less than 1.7, and
etching selectivity of the upper layer is 10 or more compared to the lower layer in fluorine-based dry etching.

13. The phase shift mask according to claim 12, wherein the transparent substrate comprises quartz.

14. The phase shift mask according to claim 12, wherein the film thickness of the lower layer is 2 to 10 nm and the film thickness of the upper layer is 50 to 80 nm.

15. The phase shift mask according to claim 13, wherein the film thickness of the lower layer is 2 to 10 nm and the film thickness of the upper layer is 50 to 80 nm.

16. The phase shift mask according to claim 12, wherein the transition metal in the upper layer is molybdenum (Mo) and the content of molybdenum (Mo) for the sum of silicon (Si) and molybdenum (Mo) is 20% or less.

17. The phase shift mask according to claim 13, wherein the transition metal in the upper layer is molybdenum (Mo) and the content of molybdenum (Mo) for the sum of silicon (Si) and molybdenum (Mo) is 20% or less.

18. The phase shift mask according to claim 14, wherein the transition metal in the upper layer is molybdenum (Mo) and the content of molybdenum (Mo) for the sum of silicon (Si) and molybdenum (Mo) is 20% or less.

19. The phase shift mask according to claim 15, wherein the transition metal in the upper layer is molybdenum (Mo) and the content of molybdenum (Mo) for the sum of silicon (Si) and molybdenum (Mo) is 20% or less.

20. The phase shift mask according to claim 12, wherein further comprising a light shielding film containing chromium on the phase shift film, and etching selectivity of the light shielding film is 1.2 or more and 10.0 or less compared to the lower layer in chlorine-based dry etching.

* * * * *